March 20, 1962 C. G. DAVIS 3,026,510

SELF TIMED PCM ENCODER

Filed Oct. 2, 1959 2 Sheets-Sheet 1

INVENTOR
C. G. DAVIS
BY R. B. Ardis
ATTORNEY

March 20, 1962 C. G. DAVIS 3,026,510

SELF TIMED PCM ENCODER

Filed Oct. 2, 1959 2 Sheets-Sheet 2

INVENTOR
C. G. DAVIS
BY R. B. Andis
ATTORNEY

1

3,026,510

SELF TIMED PCM ENCODER

Claude G. Davis, Morristown, N.J., assignor to Bell Telephone Laboratories, Incorporated, New York, N.Y., a corporation of New York Filed Oct. 2, 1959, Ser. No. 844,057
6 Claims. (Cl. 340—347)

This invention relates to encoders for pulse systems and more particularly to encoders for use in the transmitters of communication systems employing pulse code modulation.

In pulse modulation systems a speech wave or other signal to be transmitted is sampled periodically to ascertain its instantaneous amplitude. The instantaneous amplitudes (PAM signals) are then transformed by an encoder into pulse code form. One type of encoder for transforming a PAM signal into an $n$-digit code of marks and spaces occupying $n$ time slots comprises $n$ encoding stages each of which, when operated, generates a reference pulse of standard amplitude. The encoding stages are operated sequentially with a given one of the $n$ encoding stages being initially operated during a given one of the $n$ time slots. A comparison between the PAM signal and the reference pulses is made and a code output dependent upon this comparison is generated by the encoder.

The proper functioning of such an encoder is dependent upon the proper sequential operation of the encoding stages. In the past, the operation of each encoding stage has been governed by the application of a so-called digit pulse during the proper time slot. In an encoder employing stages, $n$ digit pulses sequentially appearing on $n$ separate input lines during the proper time slots were required to operate the encoding stages sequentially. In addition an $(n+1)$th pulse occurring during the $(n+1)$th time slot and appearing on an $(n+1)$th input line was required to prepare all the encoding stages for encoding the next sample. Each of the $n+1$ pulses was present on its associated input line only during one of the $n+1$ time slots in each encoding cycle; during the remainder of each encoding cycle there was no output present on its associated input line.

This type of operation therefore required $n+1$ distinct input lines, one for each input pulse, although each input line carried only one digit pulse, in a unique time slot, during each encoding cycle of $n+1$ time slots. To supply $n+1$ digit pulses over $n+1$ input lines required relatively complex and expensive digit pulse generators.

One object of the invention is to eliminate the need for an external digit pulse generator in encoding apparatus.

A related object of the invention is to reduce the overall complexity and cost of encoding apparatus.

This invention incorporates the facility for sequential operation in the encoder itself. The only timing input required is a train of pulses, called clock pulses, in which a pulse appears on a single input line during each of the $n+1$ time slots. The output signal from each stage of the encoder is differentiated and the simultaneous application of the differentiated signal and a clock pulse to AND gates is used to turn on the succeeding stage and, when required, turn off the preceding stage. In a specific embodiment of the invention the clock pulse input is converted into two sets of pulses with one set containing the odd numbered clock pulses and the second set containing the even numbered clock pulses. One set of clock pulses is used to turn on the even numbered stages and turn off the odd numbered stages while the other set of clock pulses is used to turn on the odd numbered stages and turn off the even numbered stages.

This invention will be more fully comprehended from the following detailed description taken in conjunction with the drawings in which.

Figure 1:
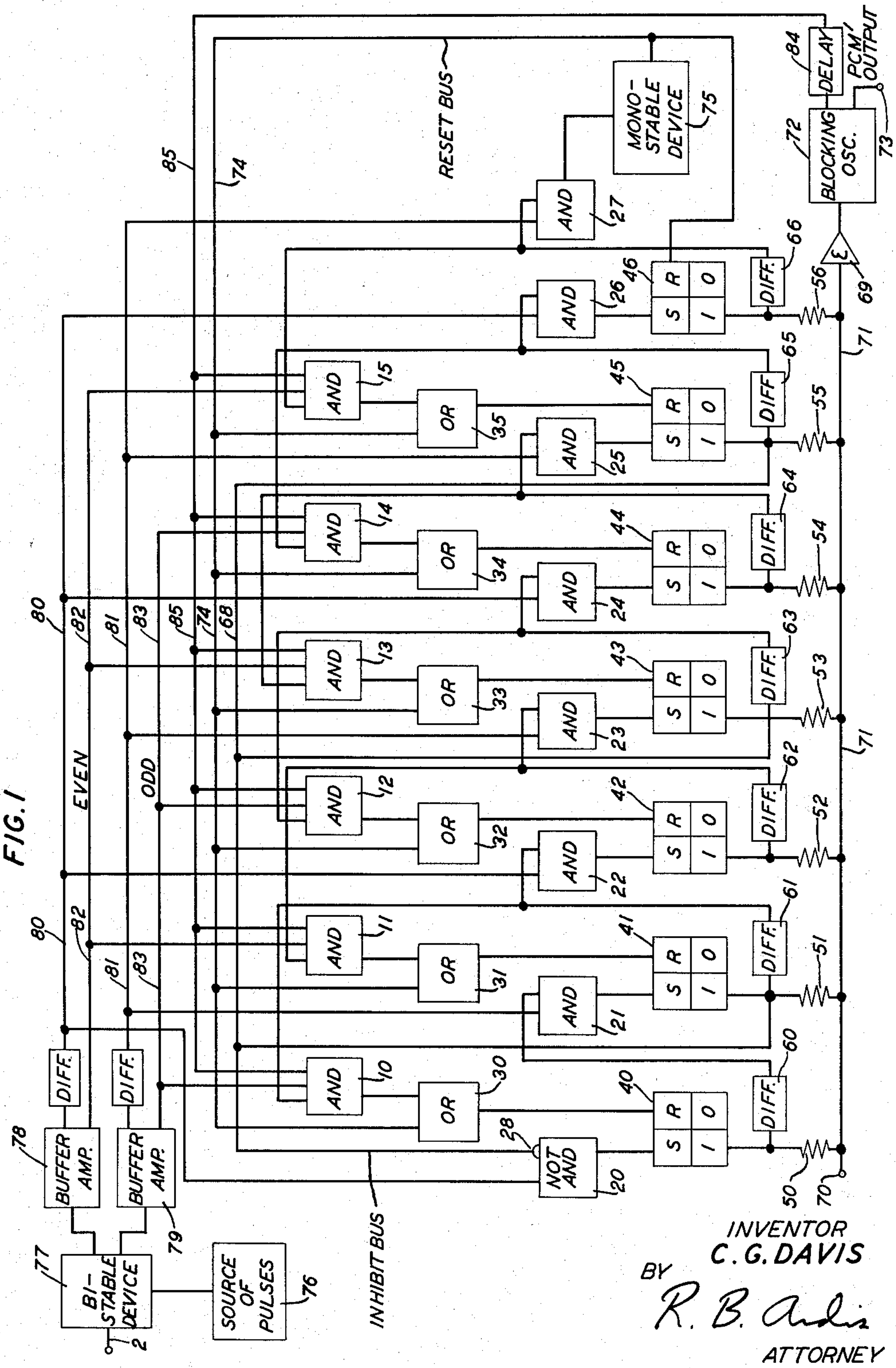
FIG. 1 is a block diagram of a seven-digit encoder embodying the invention.

Although the symbolic diagrams employed in the drawings are fairly conventional, they will first be described briefly. An AND gate, such as any of the AND gates 10 through 15 or 21 through 27, has a plurality of input leads but produces an output only when all input leads are simultaneously enabled. An OR gate, such as any of the OR gates 30 through 35, has a plurality of input leads but produces an output when any one or more of its input leads is enabled. The NOT AND gate 20 has two input leads and produces an output only when its first input lead is enabled and no signal is applied to its second input lead. The signal preventing the NOT AND gate from producing an output is called an inhibiting signal and the terminal to which it is applied is called the inhibiting terminal. When the NOT AND gate is represented by a single block as is NOT AND gate 20 the inhibiting terminal is distinguished by the half circle 28. A NOT AND gate is described generally on page 402 of "Pulse and Digital Circuits" by Millman and Taub, McGraw-Hill Book Co., Inc. 1956.

Bistable devices 40 through 46 and weighting resistors 50 through 56 comprises the coding circuit of the encoder. The appearance of a pulse at the output of NOT AND gate 20 triggers bistable device 40 into the one of its two stable conditions wherein a reference voltage is applied to weighting resistor 50 and differentiator 60. Similarly, the appearance of an output pulse from any AND gate 21 through 26 triggers its respective bistable device 41 through 46 into the one of its two stable conditions wherein a reference voltage is applied to weighting resistors 51 through 56 respectively and differentiator circuits 61 through 66 respectively. In the case of bistable devices 41, 43 and 45 respectively, the appearance of an output pulse from AND gates 21, 23 and 25 respectively also causes a reference voltage to be applied to inhibit bus 68.

The above-described operation of triggering a bistable device to generate a reference voltage is called "setting" the bistable device. The setting of a bistable device is indicated in the drawing of a bistable device by having the input line from its respective gate enter the "S" portion of the box representing the bistable device, with the weighting resistors, differentiating circuits, and connections to bus 68 being drawn to the "1" portion of the box representing the bistable device. The appearance of a pulse at the output of any one of OR gates 30 through 35 triggers its respective bistable device 40 through 46 into the one of its two stable conditions which causes a ground to be applied to weighting resistors 50 through 56, differentiating circuits 60 through 66, and, in the case of bistable devices 41, 43 and 45, to bus 68. This operation is called "resetting" the bistable device and is indicated in the drawing of a bistable device by having the line by which the resetting pulse is applied enter the "R" portion of the box representing the bistable device.

Error amplifier 69 is a stable high gain D.-C. amplifier with a low input impedance. The amplifier acts as a current summing node in that it produces an output only when current flows from the error amplifier. The output of the amplifier is constant over a great input range, since it is a very high gain amplifier and is provided with a non-linear feedback path which severely limits gain after a predetermined output level is reached.

The circuit illustrated is a sequential type seven-digit binary encoder. Such an encoder performs comparisons between each applied PAM sample and a sequence of reference pulses of standard amplitude. A code output dependent on the comparisons and representative of each sample is generated by the encoder. The reference pulses are generated by seven bistable devices 40 through 46 with associated output resistors 50 through 56. The latter are weighted in binary fashion so that if resistor 50 is equal to R, then resistor 51 is equal to 2R, resistor 52 is equal to 4R, resistor 53 is equal to 8R, resistor 54 is equal to 16R, resistor 55 is equal to 32R, and resistor 56 is equal to 64R.

The PAM samples are applied to the input channel 70 of the encoder. During the first time slot an output pulse from NOT AND gate 20 is applied to bistable device 40 causing it to set. Resistor 50 draws 64 units of current. If the input sample exceeds 64 units then current flows through conductor 71 to error amplifier 69. Error amplifier 69 generates no output when current flows into it, and bistable device 40 will remain set. If the input sample is less than 64 units of current then current flows from error amplifier 69 to resistor 50. When current flows from error amplifier 69 to resistor 50 error amplifier 69 produces an output. This output is applied to blocking oscillator 72. Blocking oscillator 72 generates a pulse output which is applied to PCM′ output terminal 73, and is also used to reset bistable device 40 during the beginning of the second time slot. Thus, if the PAM sample exceeds 64 units bistable device 40 remains in its set position but if the PAM sample is less than 64 units, bistable device 40 is reset to its zero position.

During the beginning of the second time slot an output pulse from AND gate 21 sets bistable device 41. Resistor 51 draws 32 units of current. If bistable device 40 is still in its set position the pulse sample must be greater than 64+32 units in order for current to flow into the error amplifier 69. If the sample is less than 64+32 units, current flows from error amplifier 69 into resistor 51. If current flows into error amplifier 69 no output is generated and bistable device 41 remains in its set position. If, however, current flows out of error amplifier 69 there is an output from the error amplifier. This output causes blocking oscillator 72 to generate a pulse which is applied to the PCM′ output terminal 73, and is also used to reset bistable device 41 during the beginning of the third time slot. If bistable device 40 were reset at the beginning of the second time slot, the pulse sample must be greater than 32 units in order for current to flow into the error amplifier 69. If the sample is less than 32 units current flows from error amplifier 69. If current flows into error amplifier 69 no output is generated and bistable device 41 remains set. If, however, current flows out of error amplifier 69 then there is an output from the error amplifier which causes bistable device 41 to be reset.

During subsequent time slots, further comparisons are made until the seven-digit PCM′ output is completed, at which time the PAM sample is removed and the circuit is readied, by the application of a pulse to reset bus 74 by monostable device 75, for a new sample and a new sequence of comparisons. The output has been labeled PCM′ since it is actually the inverse of the usual binary code. That is to say, if the sample is sufficient in amplitude to cause current to flow into the error amplifier 69 no output pulse is produced; if the error amplifier must supply current to the weighting resistors an output pulse is produced. This output contains all the information contained in the usual binary code and may be transmitted without the necessity of conversion to the usual binary code.

As thus far described, the operation is that of a conventional seven-digit sequential encoder. In the prior art, the sequential operation for such a seven-digit encoder of this type was governed by the application of eight-digit pulses appearing on eight separate input lines. In accordance with this invention, the circuitry for effecting the necessary sequential operation is incorporated into the encoder itself. The only timing input required is a train of pulses, called clock pulses, in which a pulse appears on a single input line during each of the $n+1$ time slots. The output signal from each stage of the encoder is differentiated and the simultaneous application of the differentiated signal and a clock pulse to AND gates is used to turn on the succeeding stage and, when required, turn off the preceding stage.

Figure 2:
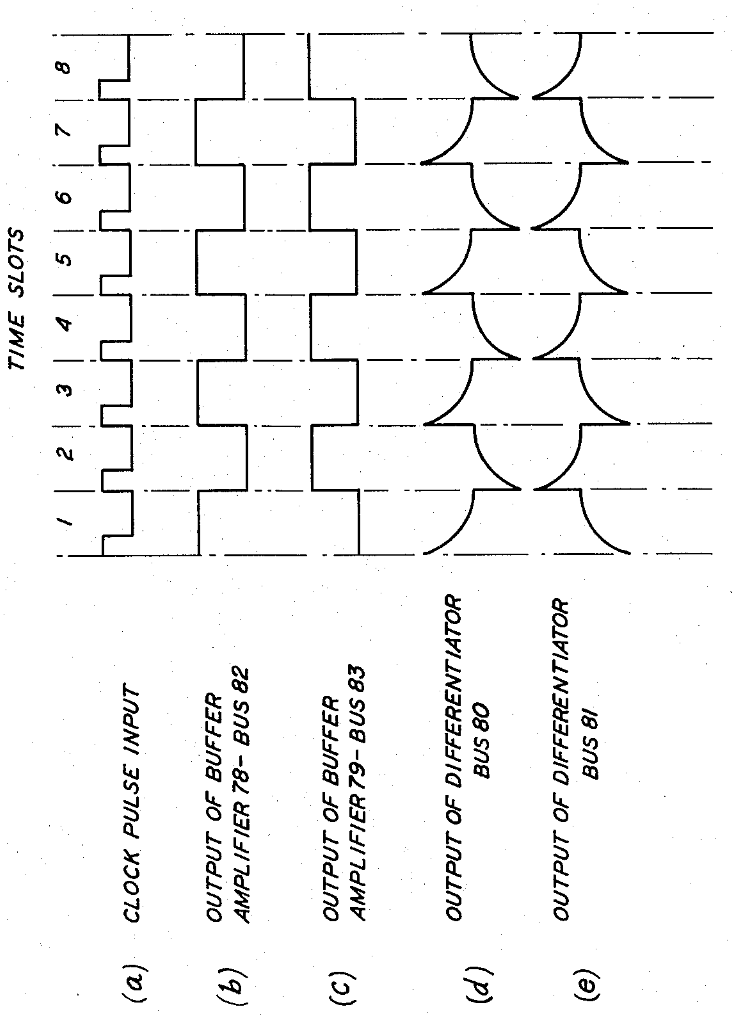
FIG. 2 is a group of wave forms useful in explaining the operation of the encoder.

The clock circuitry receives, from a source of continuous pulses 76 a train of clock pulses at the basic pulse repetition rate $f$ of the encoder (wave form $a$ of FIG. 2). The clock pulses upon application to a single input bistable device 77 produce two phase displaced trains of pulses, each at a rate $$\frac{f}{2}$$

at the outputs of buffer amplifiers 78 and 79, respectively (wave forms $b$ and $c$ of FIG. 2). These phase displaced trains are termed even clock pulses and odd clock pulses respectively. The even clock pulses are used to turn on the even numbered stages 40, 42, 44 and 46, and turn off the odd numbered stages 41, 43 and 45. The odd clock pulses are used to turn on the odd numbered stages 41, 43 and 45, and turn off the even numbered stages 40, 42, 44 and 46. Actually, the turn on pulses are produced by differentiating the respective clock trains.

The even differentiated clock pulses, which are used to turn on the even numbered stages, appear on bus 80 and are applied to one input of NOT AND gate 20, and to one input of each of the AND gates 22, 24 and 26. The odd differentiated clock pulses which are used to turn on the odd numbered stages appear on bus 81 and are applied to one input of each of the AND gates 21, 23, 25 and 27. To control the turn off of the odd numbered encoding stages at the proper time, the even clock pulses are applied to AND gates 11, 13 and 15 by means of bus 82. To control the turn off of the even numbered encoding stages at the proper time, the odd clock pulses are applied by bus 83 to AND gates 10, 12 and 14. During the beginning of the first time slot a clock pulse is applied to NOT AND gate 20 from bus 80, and since there is no inhibiting pulse applied to terminal 28 of NOT AND gate 20 an output pulse from NOT AND gate 20 sets bistable device 40. If the input sample, as aforedescribed, does not cause an output pulse to appear from blocking oscillator 72 then bistable device 40 will remain set during the remainder of the encoding cycle. If the input sample is such that blocking oscillator 72 generates a pulse output then bistable device 40 will be reset. The resetting of bistable device 40 is accomplished by delaying the pulse output of blocking oscillator 72 for one time slot by means of delay circuit 84, and applying the delay pulse to a second input of AND gate 10. The delayed output pulse appears at AND gate 10 at the beginning of the second time slot. At the same time a clock pulse appears on bus 83 which is also connected to an input of AND gate 10. In the meantime, the output of bistable device 40 has also been applied to differentiator 60 which causes a voltage to be applied to AND gate 21. The time constant of differentiator 60 is so chosen that a sufficient voltage remains at the beginning of the second time slot so that this voltage together with the clock pulse which appears on bus 81 causes an output pulse to be applied by AND gate 21 to bistable device 41 thus setting bistable device 41. A reference voltage is thus applied to differentiating circuit 61 causing voltage to be applied to the third input terminal of AND gate 10. Thus, if the PAM sample is such that blocking oscillator 72 generates an output pulse there are simultaneously applied to AND gate 15, three input pulses immediately after the beginning of the second time slot which are: the odd clock pulse appearing on bus 83, the delayed PCM′ output appearing on bus 85, and the output differentiator 61. Two of these pulses, i.e., the output of differentiator 61 and the pulse appearing on bus 81 will always be present at the beginning of the second time slot. The appearance of the third pulse on the delayed PCM′ output bus 85 is dependent on the sample being of such magnitude that blocking oscillator 72 generates an output pulse.

As described above bistable device 41 is set during the beginning of the second time slot. If the PAM sample is of such magnitude that blocking oscillator 72 generates an output pulse this output pulse is delayed by delay circuit 84 and applied to AND gate 11 by means of bus 85. The pulse on bus 85 will combine at the beginning of the third time slot with the clock pulse then applied to AND gate 11 by means of bus 82, and the pulse applied to AND gate 11 from the output of differentiator 62. The resulting output from AND gate 11 will pass through OR gate 31 and reset bistable device 41.

At the beginning of a third time slot a clock pulse appears on bus 80. It is desired that this pulse set bistable device 42 and bistable device 40 is prevented from being actuated by the presence of an inhibiting pulse on bus 68 which is connected to NOT AND gate 20. The inhibiting pulse is placed on bus 68 because the output of bistable device 41 is connected to bus 68 and bistable device 41 is still set at the beginning of the third time slot. AND gates 24 and 26 which are also connected to bus 80 are prevented from setting their respective bistable devices 44 and 46 because there is as yet no output appearing from differentiators 63 or 65 respectively.

The above-described process continues with each bistable device 42, 44 and 46 being set by the simultaneous occurrence of a clock pulse on bus 80 and the output of differentiators 61, 63 and 65 respectively. Bistable devices 43 and 45 are set by the simultaneous occurrence of a pulse appearing on bus 81 and the output voltage appearing on differentiators 62 and 64. An output pulse is produced as is above described only when it is necessary for error amplifier 69 to supply current to the weighting resistors whose bistable devices are set. No output pulse is produced when the PAM sample causes current to flow into error amplifier 69. At the beginning of the eighth time slot a pulse appearing on bus 81 combines with the output of differentiator 66 to cause monostable device 75 to change from its stable to its quasi stable state. The output of monostable device 75 is connected to each of the OR gates 30 through 35 via bus 74, and to bistable device 46 so that the output of monostable device 75 causes all the bistable devices which are set to be reset. A new sample is now applied to the encoder from the second channel, and the process is repeated.

Alternate clock pulses in differentiated form, which appear on buses 80 and 81, have been provided in order to distinguish more clearly between desired and undesired clock pulses at the AND gates 21 through 27, and to avoid having to set the triggering levels of the bistable devices with precision. For example, suppose that all the AND gates 21 through 27 were connected to a single bus on which continuous clock pulses such as those shown in wave form *a* of FIG. 3 were provided. At the beginning of the third time slot the third clock pulse might set bistable device 41 as well as bistable device 42. This results from the fact that the output of differentiator 60 may not have decayed sufficiently so that it acts in conjunction with the third clock pulse on AND gate 21 and sets bistable device 41. Similar problems would occur at the beginning of ensuing time slots. To avoid this problem alternate clock pulses shown in lines *d* and *e* of FIG. 2 respectively are provided in differentiated form on buses 80 and 81. The even differentiated pulses appearing on bus 80 are used to turn on the even numbered bistable devices 40, 42, 44 and 46 of the encoder, and the odd differentiated pulses appearing on bus 81 are used to turn on the odd numbered bistable devices 41, 43 and 45 of the encoder. This arrangement allows two time slots instead of one time slot for the differentiated output of a bistable device to disappear before a clock pulse is again applied to the AND gate of the succeding bistable device and thus prevents faulty triggering of the bistable devices. The alternate clock pulses in non-differentiated form, shown in lines *b* and *c* of FIG. 3 and appearing on buses 82 and 83 respectively are used to reset the encoding stages. The pulses appearing on bus 82 are used to turn off the odd numbered bistable devices 41, 43 and 45 of the encoder in the manner aforedescribed, and the pulses appearing on bus 82 are used to turn off the even numbered bistable devices 40, 42, 44 and 46 of the encoder in the manner aforedescribed.

It is to be understood that the above-described arrangements are illustrative of the application of the invention. Numerous other arrangements may be devised by those skilled in the art without departing from the spirit and scope of the invention.

What is claimed is:

1. In a PCM encoder for transforming a signal amplitude sample into a code of marks and spaces, a series of encoding stages each comprising means to generate a reference pulse of standard amplitude, means to compare the amplitude of said reference pulse with said signal sample, means to generate an output dependent on said comparison, and means responsive to said reference pulse output of each encoding stage to sequentially operate the succeeding stage.

2. In a PCM encoder for transforming a signal amplitude sample into a code of marks and spaces, a series of encoding stages each comprising means to generate a reference pulse of standard amplitude, means to compare the amplitude of said reference pulse with said signal sample, means to generate an output dependent on said comparison, means responsive to said reference pulse output of each encoding stage to sequentially operate the succeeding stage, and means responsive to the output dependent on the comparison between the signal sample and a reference pulse of standard amplitude generated by a first operated encoding stage and the reference pulse output of the next sequentially operated encoding stage to turn off the first operated encoding stage.

3. In a PCM encoder for transforming a signal amplitude sample into a code of marks and spaces occupying a predetermined number of successive time slots, a source of pulses generating continuously recurring pulses one of said pulses appearing in each time slot, a series of encoding stages each comprising means to generate a reference pulse, means to compare the amplitude of said reference pulse with said signal sample, means to generate an output dependent on said comparison, and means responsive to said reference pulse output of each encoding stage and the pulse which is next generated by said pulse source after the generation of said reference pulse to sequentially operate the succeeding stage.

4. In a PCM encoder for transforming a signal amplitude sample into a code of marks and spaces occupying a predetermined number of successive time slots, a source of pulses generating continuously recurring pulses one of said pulses appearing in each time slot, a series of encoding stages each comprising means to generate a reference pulse, means to compare the amplitude of said reference pulse with said signal sample, means to generate an output dependent on said comparison, means responsive to said reference pulse output of each encoding stage and the pulse which is next generated by said pulse source after the generation of said reference pulse to sequentially operate the succeeding stage, and means responsive to the output dependent on the comparison between the signal sample and reference pulse of standard amplitude generated by a first operated encoding stage, the reference pulse output of the next sequentially operated encoding stage, and the pulse which is next generated by said pulse source after the generation of said reference pulse by said first operated encoding stage to turn off the first operated encoding stage.

5. In a PCM encoder for transforming a signal amplitude sample into a code of marks and spaces occupying a predetermined number of successive time slots, a source of pulses generating continuously recurring pulses one of said pulses appearing in each time slot, means connected to said pulse source to alternately generate said pulses on a first bus and a second bus, a series of odd and even numbered encoding stages each comprising means to generate a reference pulse, means to compare the amplitude of said reference pulse with said signal sample, means to generate an output dependent on said comparison, means responsive to the reference pulse output of each odd numbered encoding stage and the pulse which next occurs on said first bus after the generation of said reference pulse by said odd numbered encoding stage to sequentially operate the succeeding even numbered encoding stage, and means responsive to the reference pulse output of each even numbered encoding stage and the pulse which next occurs on said second bus after the generation of said reference pulse by said even numbered encoding stage to sequentially operate the succeeding odd numbered encoding stage.

6. In a PCM encoder for transforming a signal amplitude sample into a code of marks and spaces occupying a predetermined number of successive time slots and appearing on an output channel, a source of pulses generating continuously recurring pulses one of said pulses appearing in each time slot, means connected to said source of pulses to alternately generate said pulses on a first bus and a second bus, a series of odd and even numbered encoding stages each comprising means to generate a reference pulse, means to compare the amplitude of said reference pulse with said signal sample, means to generate an output dependent on said comparison, means responsive to the reference pulse output of each odd numbered encoding stage and the pulse which next occurs on said first bus after the generation of said reference pulse by said odd numbered encoding stage to sequentially operate the succeeding even numbered encoding stage, means responsive to the reference pulse output of each even numbered encoding stage and the pulse which next occurs on said second bus after the generation of said reference pulse by said even numbered encoding stage to sequentially operate the succeeding odd numbered encoding stage, means for feeding back marks and spaces from said output channel, means responsive to said fed output and said pulses on said second bus for determining whether a reference pulse shall continue to be generated by an even numbered encoding stage, and means responsive to said fed output and said pulses on said first bus for determining whether a reference pulse shall continue to be generated by an odd numbered encoding stage.

References Cited in the file of this patent

UNITED STATES PATENTS

| | | |
|---|---|---|
| 2,549,422 | Carbrey | Apr. 17, 1951 |
| 2,610,295 | Carbrey | Sept. 9, 1952 |
| 2,754,503 | Forbes | July 10, 1956 |